United States Patent [19]
Majumdar et al.

[11] Patent Number: 5,686,859
[45] Date of Patent: Nov. 11, 1997

[54] SEMICONDUCTOR SWITCH INCLUDING A PRE-DRIVER WITH A CAPACITIVELY ISOLATED POWER SUPPLY

[75] Inventors: Gourab Majumdar; Shinji Hatae, both of Tokyo; Masayuki Koura, Fukuoka, all of Japan

[73] Assignee: Mitsubishi Denki Kabushiki Kaisha, Tokyo, Japan

[21] Appl. No.: 597,128

[22] Filed: Feb. 6, 1996

[30] Foreign Application Priority Data

Apr. 28, 1995 [JP] Japan ............... 7-105282

[51] Int. Cl.$^6$ ............................ H03B 1/00
[52] U.S. Cl. ............. 327/530; 327/110; 327/423
[58] Field of Search ............... 307/125, 130, 307/131, 412; 327/108, 109, 110, 111, 112, 365, 423, 424, 494, 530

[56] References Cited

U.S. PATENT DOCUMENTS

| | | |
|---|---|---|
| 5,055,721 | 10/1991 | Majumdar et al. .............. 307/570 |
| 5,543,740 | 8/1996 | Wong ......................... 327/108 |

*Primary Examiner*—Timothy P. Callahan
*Assistant Examiner*—Jeffrey Zweizig
*Attorney, Agent, or Firm*—Oblon, Spivak, McClelland, Maier & Neustadt, P.C.

[57] ABSTRACT

When an IGBT element (9) is turned off and an IGBT element (19) is turned on, capacitors (1, 2) are charged by a current successively passing through the capacitor (1), a resistive element (4), a diode (5), the capacitor (2) and an intermediate wire (32) from a high-potential dc bus (30). At the same time, a capacitor (11) is discharged by a current successively passing through a diode (17), a resistive element (16) and the capacitor (11) from a low-potential dc bus (31) to flow to the intermediate wire (32). When the IGBT element (9) is turned on and the IGBT element (19) is turned off, on the other hand, the capacitors (11, 12) are charged and the capacitor (1) is discharged. The above is so repeated as to maintain source voltages of driving circuits (8, 18) at values exceeding constant levels. Thus, a power circuit for a driving circuit is formed by a simple circuit element.

11 Claims, 9 Drawing Sheets

SEMICONDUCTOR SWITCH INCLUDING A PRE-DRIVER WITH A CAPACITIVELY ISOLATED POWER SUPPLY

BACKGROUND OF THE INVENTION

1. Field of the Invention

The present invention relates to a switching semiconductor device, and more particularly, it relates to an improvement in a circuit for supplying a source voltage to a driving circuit for driving a switching semiconductor element.

2. Description of the Background Art

A switching semiconductor device is a semiconductor device which comprises a switching semiconductor element for switching a main current on and off, and a circuit for driving this element. A typical example of such a switching semiconductor device is an IGBT module which is formed by employing an IGBT (insulated gate bipolar transistor) element as the switching semiconductor element and packaging the same with a driving circuit therefor, or a bridge device or an invertor device which is integrated with the IGBT module.

FIG. 8 is a circuit diagram showing the structure of a conventional invertor device which is integrated with IGBT modules. As shown in FIG. 8, this invertor device comprises a three-phase bridge device 54 which is integrated with six IGBT modules. A three-phase ac voltage which is supplied from an external three-phase ac power source 51 is converted to a dc voltage by a rectifying circuit 52.

The dc voltage is smoothed by a smoothing capacitor 53, and supplied to the three-phase bridge device 54 by a high-potential dc bus 57 and a low-potential dc bus 58. In the three-phase bridge device 54, IGBT elements which are provided on the six IGBT modules alternately carry out ON/OFF operations at desired cycles, thereby forming a three-phase ac voltage of a desired cycle and supplying the same to a load 56.

Each of the six IGBT modules is provided with a driving circuit for driving each IGBT element. Therefore, the invertor device comprises six power circuits 64 for supplying dc source voltages to these driving circuits. Every IGBT module is provided with a single power circuit 64. The invertor device is further provided with a transformer 59, so that each power circuit 64 is connected to a secondary winding of this transformer 59. A MOS transistor 63 serving as a switching element is connected in series with a primary winding of the transformer 59, and this series circuit is interposed between the high-potential and low-potential dc buses 57 and 58.

An integrated circuit 62 for driving the MOS transistor 63 is connected to its gate electrode. Further, a power circuit 65 for supplying a source voltage to the integrated circuit 62 is connected to another secondary winding of the transformer 59. Further, the integrated circuit 62 is connected with another integrated circuit 61 for outputting one-shot pulses to the integrated circuit 62 when the dc source voltage rises across the dc buses 57 and 58 immediately after power is supplied to the invertor device. This integrated circuit 61 is connected to the dc buses 57 and 58, to obtain the source voltage. Further, a resistive element 55 for limiting the current is interposed between the high-potential dc bus 57 and the integrated circuit 61.

FIG. 9 is a timing chart showing voltage waveforms of the respective parts of this invertor device. When the invertor device is connected to the three-phase ac power source 51, the voltage across the dc buses 57 and 58 is increased to reach a prescribed stationary voltage after a lapse of a constant time, as shown in FIG. 9. When the voltage across the dc buses 57 and 58 reaches a voltage of several volts in the process of the increase, the integrated circuit 61 outputs one-shot pulses to the integrated circuit 62 as a transient source voltage.

The integrated circuit 62 starts its operation by receiving the transient source voltage. Namely, the integrated circuit 62 outputs periodically repeated pulses to the gate electrode of the MOS transistor 63. Consequently, the MOS transistor 63 periodically repeats ON/OFF operations. Thus, an alternating current flows to the primary winding of the transformer 59. Consequently, an ac voltage is applied across the power circuits 64 and 65 which are connected to the secondary windings of the transformer 59.

In each of the power circuits 64 and 65, the applied ac voltage is rectified by action of a diode 23, smoothed by action of a capacitor 24, and clamped to a constant voltage by action of a Zener diode 25. Namely, the power circuits 64 and 65 output dc constant voltages to the driving circuits provided on the three-phase bridge device 54 and the integrated circuit 62 respectively.

When the supply of the dc source voltage from the power circuit 65 to the integrated circuit 62 is started, the operation of the integrated circuit 62 thereafter lasts with no supply of the dc voltage from the integrated circuit 61. Therefore, the output of the dc voltage from the integrated circuit 61 is stopped after a lapse of a constant time. Thus, the driving circuits provided on the three-phase bridge device 54 sustainably receive the dc source voltage, to correctly ON/OFF drive the IGBT elements. Consequently, the three-phase ac voltage is sustainably outputted from the three-phase bridge device 54 to the load 56.

However, the conventional invertor device which is integrated with the IGBT modules requires the transformer 59, the integrated circuits 61 and 62, and the power circuit 65 for the integrated circuit 62, in order to form the source voltages of the driving circuits provided for the IGBT modules. Therefore, the invertor device is disadvantageously complicated in structure and increased in weight as well as in manufacturing cost.

In another prior art, on the other hand, only a lightweight three-phase bridge device 54 is packaged to fabricate an invertor device, and a power unit which is integrated with a transformer 59, integrated circuits 61 and 62 and a power circuit 65 for the integrated circuit 62 is separately prepared and connected to the invertor device through a wire or the like for use. In this case, it is necessary to prepare the complicated and heavy power unit in use although the invertor device itself is simplified and reduced in weight, and the problem is not solved.

The above is a problem which is not restricted to the invertor device but common to IGBT modules and all devices which are integrated with the same, as well as general switching semiconductor devices.

SUMMARY OF THE INVENTION

According to a first aspect of the present invention, a switching semiconductor device comprises a switching semiconductor element allowing conduction between first and second main electrodes and cutting off the same, a driving circuit entering an operable state due to supply of a dc source voltage across a first source electrode and a second source electrode which is connected to the second main electrode and driving the switching semiconductor element in response to an external input signal, a first capacitor having a first end which is connected to the first main electrode of the switching semiconductor element, a first circuit which is interposed between a second end of the first capacitor and the first source electrode of the driving circuit, a second circuit which is interposed between the second end of the first capacitor and the second main electrode of the switching semiconductor element, a second capacitor which is connected between the first and second source electrodes, and a clamp element which is connected between the first and second source electrodes for clamping a voltage across the first and second source electrodes at a constant value in an operable range of the driving circuit, and the first circuit comprises a first diode which is so inserted as to feed a current only in a direction for supplying the dc source voltage across the first and second source electrodes by charging the second capacitor, while the second circuit comprises a second diode which is so inserted as to feed a current only in a direction opposite to that of the current flowing in the first circuit with respect to the first capacitor.

According to a second aspect of the present invention, the first circuit futher comprises a first resistive element connected in series with the first diode, and the second circuit further comprises a second resistive element connected in series with the second diode.

According to a third aspect of the present invention, the clamp element comprises a Zener diode clamping the voltage across the first and second source electrodes at the constant value by a Zener voltage.

According to a fourth aspect of the present invention, the switching semiconductor element comprises an insulated gate switching semiconductor element.

According to a fifth aspect of the present invention, a switching semiconductor device comprises first and second unit semiconductor devices which are connected in series with each other, each of the first and second unit semiconductor devices comprises a switching semiconductor element allowing conduction between first and second main electrodes and cutting off the same, and a driving circuit entering an operable state due to supply of a dc source voltage across a first source electrode and a second source electrode which is connected to the second main electrode and driving the switching semiconductor element in response to an external input signal, at least one of the first and second unit semiconductor devices comprises a first capacitor having a first end which is connected to the first main electrode of the switching semiconductor element, a first circuit which is interposed between a second end of the first capacitor and the first source electrode of the driving circuit, a second circuit which is interposed between the second end of the first capacitor and the second main electrode of the switching semiconductor element, a second capacitor which is connected between the first and second source electrodes, and a clamp element which is connected between the first and second source electrodes for clamping a voltage across the first and second source electrodes at a constant value in an operable range of the driving circuit, the first circuit comprises a first diode which is so inserted as to feed a current only in a direction for supplying the dc source voltage across the first and second source electrodes by charging the second capacitor, the second circuit comprises a second diode which is so inserted as to feed a current only in a direction opposite to that of the current flowing in the first circuit with respect to the first capacitor, and the first and second unit semiconductor devices are connected in series with each other through connection between the second main electrode of the first unit semiconductor device and the first main electrode of the second unit semiconductor device.

According to a sixth aspect of the present invention, each of the first and second unit semiconductor devices comprises the first capacitor, the first circuit, the second circuit, the second capacitor, and the clamp element.

According to the seventh aspect of the present invention, only one of the first and second semiconductor devices comprises the first capacitor, the first circuit, the second circuit, the second capacitor, and the clamp element, the other one of the first and second unit semiconductor devices further comprises a transformer having a first winding which is connected to the first and second source electrodes of the driving circuit provided on the other one, a third diode which is interposed between the first winding and the first or second source electrode of the other one, a third capacitor which is connected between the first and second source electrodes of the other one, and another clamp element which is connected between the first and second source electrodes of the other one for clamping the voltage across the first and second source electrodes at a constant value in an operable range of the driving circuit of the other one, and the third diode is so interposed as to feed a forward current in a direction for supplying a dc source voltage capable of driving the driving circuit of the other one across the first and second source electrodes of the other one by charging the third capacitor.

According to an eighth aspect of the present invention, the switching semiconductor device further comprises a plurality of bridge circuits which are connected in series with each other, each of the plurality of bridge circuits comprises the first and second unit semiconductor devices which are connected in series with each other, the first and second unit semiconductor devices are connected in series with each other through connection between the second main electrode of the first unit semiconductor device and the first main electrode of the second unit semiconductor device, and the first main electrodes of the first unit semiconductor devices belong to respective ones of the plurality of bridge circuits which are connected with each other and the second main electrodes of the second unit semiconductor devices belong to respective ones of the plurality of bridge circuits which are connected with each other, thereby connecting the plurality of bridge circuits in parallel with each other.

In the device according to the first aspect of the present invention, the first and second main electrodes are connected to an external dc voltage source through a load, to carry out correct operations. When a main current which is fed by conduction of the switching semiconductor element flows from the first main electrode to the second main electrode, for example, a high-potential source voltage is supplied to the first main electrode while a low-potential source voltage is supplied to the second main electrode. When a dc voltage is applied across the first and second main electrodes due to the connection of the external dc voltage source as to this example, the current flows from the first main electrode to the second main electrode while successively passing through the first capacitor, the first circuit and the second capacitor. The first and second capacitors are charged by this current, whereby storage voltages thereof are increased. Consequently, the dc source voltage which is supplied to the driving circuit is increased to finally reach a prescribed stationary value which is clamped by the clamp element, whereby the driving circuit enters an operable state.

Thereafter a prescribed input signal is inputted in the driving circuit, thereby allowing the switching semiconductor element to conduct. At this time, a short is caused across the first and second main electrodes, whereby a discharge current for discharging the first capacitor which has already been charged flows from the second main electrode to the first main electrode while successively passing through the second circuit and the first capacitor. Consequently, the first capacitor is discharged and the storage voltage of the second capacitor is reduced following current consumption in the driving circuit.

Thereafter another signal is inputted in the driving circuit to cut off the switching semiconductor element, whereby the first capacitor is again charged and the second capacitor similarly recovers the storage voltage. Thus, a repetitive switching operation of alternately allowing conduction of the switching semiconductor element and cutting off the same is so carried out that a dc source voltage is stationarily supplied to the driving circuit. Namely, it is possible to maintain the operation of the device.

When the direction of the main current of the switching semiconductor element is opposite to the above, the direction of the voltage which is supplied from the external dc voltage source and those of the currents for charging and discharging the first capacitor are reversed. Also in this case, a repetitive switching operation of alternately allowing conduction of the switching semiconductor element and cutting off the same is so carried out that a dc source voltage is stationarily supplied to the driving circuit.

In the device according to the first aspect of the present invention, as hereinabove described, a power circuit supplying a dc source voltage to the driving circuit is formed by a simple circuit comprising the first capacitor, the first circuit, the second circuit, the second capacitor and the clamp element, with no requirement for a transformer and an active integrated circuit element which have been required in the conventional device. Thus, it is possible to implement a miniature and lightweight device which is easy to package with no requirement for a power source unit for the driving circuit to be connected to the exterior and simple in structure with reduction of the fabrication cost.

In the device according to the second aspect of the present invention, the first and second circuits comprise resistive elements respectively, whereby the values of the currents contributing to charging and discharging of the first capacitor and charging of the second capacitor are limited. Thus, it is possible to prevent the first and second capacitors from breakage caused by application of a short-circuit voltage.

In the device according to the third aspect of the present invention, the clamp element comprises the Zener diode, whereby the structure is simple and an excellent clamp characteristic with low temperature dependence is attained.

In the device according to the fourth aspect of the present invention, the switching semiconductor element comprises the insulated gate switching semiconductor element, whereby a current required for driving the switching semiconductor element is small. Thus, current consumption in the driving circuit is reduced, whereby miniaturization and weight reduction of the power circuit for the driving circuit are enabled since the capacitances of the first and second capacitors can be reduced.

In the device according to the fifth aspect of the present invention, the first and second unit semiconductor devices are connected in series with each other, thereby functioning as a bridge device. Further, the power circuit for the driving circuit is formed by a simple circuit comprising the first capacitor, the first circuit, the second circuit, the second capacitor and the clamp element at least in one of the first and second unit semiconductor devices, whereby miniaturization and weight reduction of the device are implemented.

In the device according to the sixth aspect of the present invention, the power circuit for the driving circuit is formed by a simple circuit comprising the first capacitor, the first circuit, the second circuit, the second capacitor and the clamp element in each of the first and second unit semiconductor devices, whereby further miniaturization and weight reduction of the device are implemented.

In the device according to the seventh aspect of the present invention, the power circuit for the driving circuit is formed by a simple circuit comprising the first capacitor, the first circuit, the second circuit, the second capacitor and the clamp element only in one of the first and second unit semiconductor devices while the other one is formed by a transformer etc. similarly to the conventional device. When the device is connected to an external dc voltage source, therefore, the driving circuit of the other one is reliably supplied with a dc source voltage which is necessary for its operation. Thereafter this driving circuit which is operable is so driven as to allow the switching semiconductor element of the other one to conduct, whereby the dc voltage which is supplied from the external dc power source is applied to the one unit semiconductor unit as such.

Consequently, charging of the first and second capacitors of one side is quickened while it is possible to readily make the storage voltage of the second capacitor reach a sufficiently high voltage value which is necessary for the operation of the driving circuit. Namely, also when the voltage supplied from the external dc voltage source is not sufficiently high as compared with the source voltage necessary for the operation of the driving circuit, the device is readily and reliably started.

In the device according to the eighth aspect of the present invention, the plurality of bridge circuits are connected in parallel with each other, thereby functioning as an invertor device outputting a single-phase or plural-phase alternating currents. Further, the power circuit for the driving circuit is formed by a simple circuit comprising the first capacitor, the first circuit, the second circuit, the second capacitor and the clamp element in at least one of the first and second unit semiconductor devices provided in each bridge circuit, whereby miniaturization and weight reduction of the device are implemented.

Accordingly, an object of the present invention is to provide a switching semiconductor device which can enable formation of a source voltage for a driving circuit driving a switching element in a simple circuit structure, thereby simplifying the device structure, implementing weight reduction and bringing cost reduction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<1. First Embodiment>

First, a bridge device according to a first embodiment of the present invention is described.

<1-1. Structure of Device>

Figure 1:
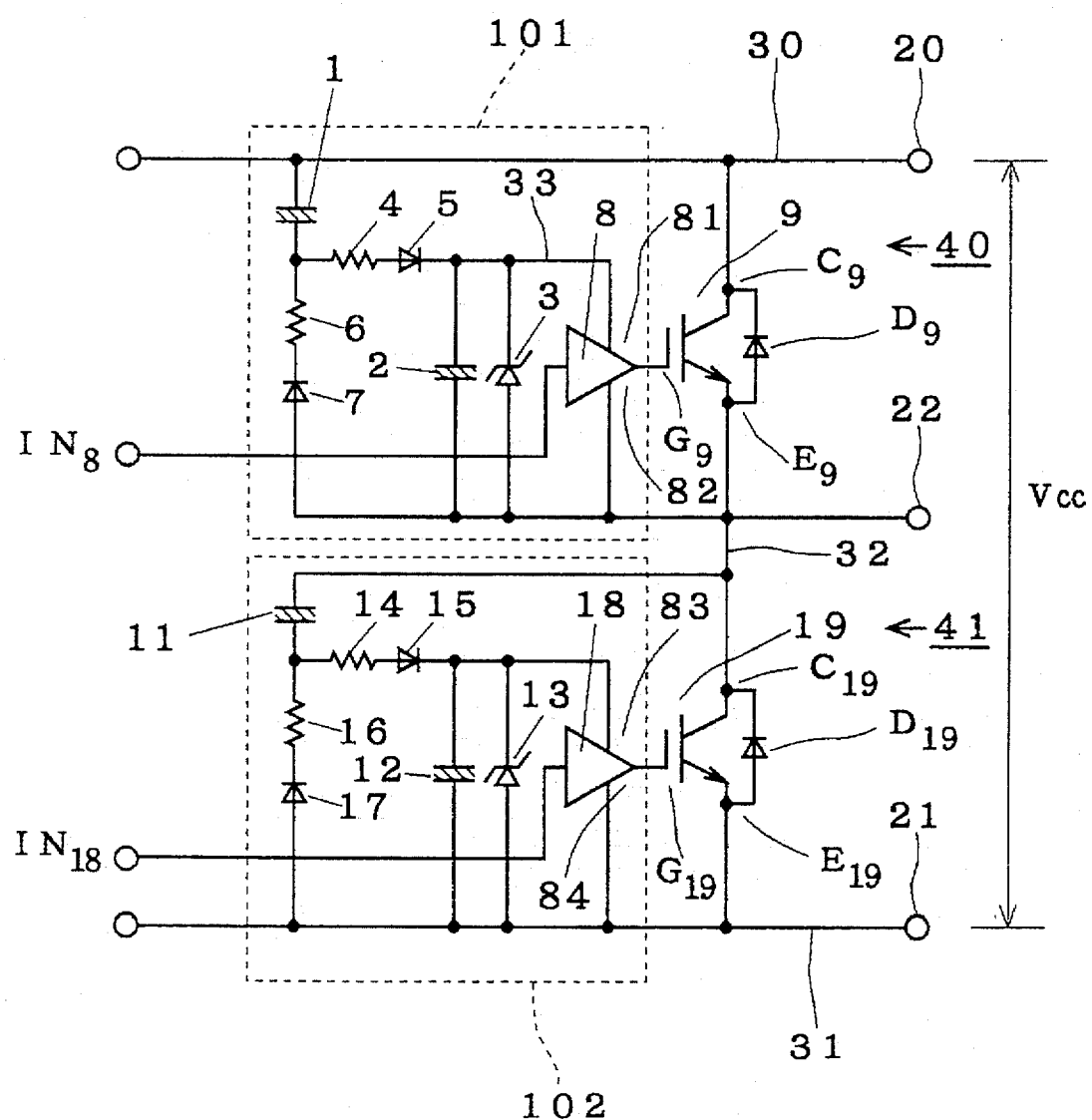
FIG. 1 is a circuit diagram showing the structure of a device according to a first embodiment.

FIG. 1 is a circuit diagram showing the bridge device according to this embodiment. In this bridge device, two IGBT modules 40 and 41 are interposed between a high-potential dc bus 30 and a low-potential dc bus 31. These dc buses 30 and 31 are supplied with an interbus voltage $V_{CC}$ through input terminals 20 and 21. An output terminal 22 is connected to an intermediate wire 32 connecting the two IGBT modules with each other. A load (not shown) is connected to the output terminal 22.

The IGBT module 40 comprises an IGBT element 9 as a switching semiconductor element. The IGBT element 9 has a collector electrode $C_9$ which is connected to the high-potential dc bus 30, and an emitter electrode $E_9$ which is connected to the intermediate wire 32. Namely, the IGBT element 9 allows conduction between the high-potential dc bus 30 and the intermediate wire 32 (on) and cuts off the same (off) in response to a gate voltage which is inputted in a gate electrode $G_9$.

A driving circuit block 101 is connected to the gate electrode $G_9$. The driving circuit block 101 comprises a driving circuit 8 for outputting the gate voltage to the gate electrode $G_9$, and a power circuit for supplying a source voltage to source electrodes 81 and 82 of the driving circuit 8. The low-potential side source electrode 82 is connected to the intermediate wire 32. The power circuit for supplying the source voltage to the driving circuit 8, which is interposed between the high-potential dc bus 30 and the intermediate wire 32, is formed by capacitors 1 and 2, resistive elements 4 and 6, diodes 5 and 7, and a Zener diode 3.

Namely, the capacitor 2 for holding the source voltage and the Zener diode 3 serving as a clamp element for suppressing the source voltage from being increased beyond a prescribed level are interposed between a high-potential power supply line 33 of the driving circuit 8 and a low-potential power supply line (coincident with the intermediate wire 32) in parallel with each other. The Zener diode 3, which has low temperature dependence and an excellent clamp characteristic, is optimum as a clamp element. A series circuit of the resistive element 4 and the diode 5 is interposed between a second end of the capacitor 1, whose first end is connected to the high-potential dc bus 30, and the high-potential power supply line 33. The diode 5 is connected in such a direction that a current flowing from the high-potential dc bus 30 to the high-potential power supply line 33 is a forward current.

Further, a series circuit of the resistive element 6 and the diode 7 is inserted between the second end of the capacitor 1 and the intermediate wire 32. The diode 7 is connected in such a direction that a current flowing from the intermediate wire 32 to the high-potential dc bus 30 is a forward current. The resistive element 4 is adapted to limit flowing of excessively high currents to the capacitors 1 and 2. On the other hand, the resistive element 6 is adapted to limit the current flowing to the capacitor 1.

Similarly to the IGBT module 40, the IGBT module 41 comprises an IGBT element 19 as a switching semiconductor element. The IGBT element 19 has a collector electrode $C_{19}$ which is connected to the intermediate wire 32, and an emitter electrode $E_{19}$ which is connected to the low-potential dc bus 31. Namely, the IGBT element 19 switches the intermediate wire 32 and the low-potential dc bus 31 on and off in response to a gate voltage which is inputted in a gate electrode $G_{19}$.

A driving circuit block 102 is connected to the gate electrode $G_{19}$. The driving circuit block 102 is formed similarly to the driving circuit block 101. Namely, the driving circuit block 102 comprises a driving circuit 18 for outputting the gate voltage to the gate electrode $G_{19}$, and a power circuit for supplying a source voltage to source electrodes 83 and 84 of the driving circuit 18. The low-potential side source electrode 84 is connected to the low-potential dc bus 31. This power circuit, which is interposed between the intermediate wire 32 and the low-potential dc bus 31, is formed by capacitors 11 and 12, resistive elements 14 and 16, diodes 15 and 17, and a Zener diode 13.

A freewheel diode $D_9$ for bypassing a reverse current thereby preventing the IGBT element 9 from breakage is connected in parallel with the IGBT element 9 in a reverse direction. Namely, a cathode electrode and an anode electrode of the freewheel diode $D_9$ are connected to the collector electrode and the emitter electrode of the IGBT element 9 respectively. Similarly, a freewheel diode $D_{19}$ is also connected reversely in parallel with the IGBT element 19.

The driving circuit 8, which is a kind of amplifier, outputs a gate voltage exceeding a gate threshold voltage and a zero voltage to the gate electrode $G_9$ respectively in response to high and low level input signals, for example, which are inputted in an input terminal $IN_8$ from the exterior, thereby implementing ON and OFF operations of the IGBT element 9 as the result. In order to repetitively implement the ON and OFF operations of the IGBT element 9 at a high frequency, a circuit having ability of outputting a high output current is selected for the driving circuit 8. The driving circuit 8 is formed by one integrated circuit element, for example. The driving circuit 18, which is formed similarly to the driving circuit 8, implements ON and OFF operations of the IGBT element 19 in response to input signals which are inputted in an input terminal $IN_{18}$.

<1-2. Operation of Device>

Figure 2:
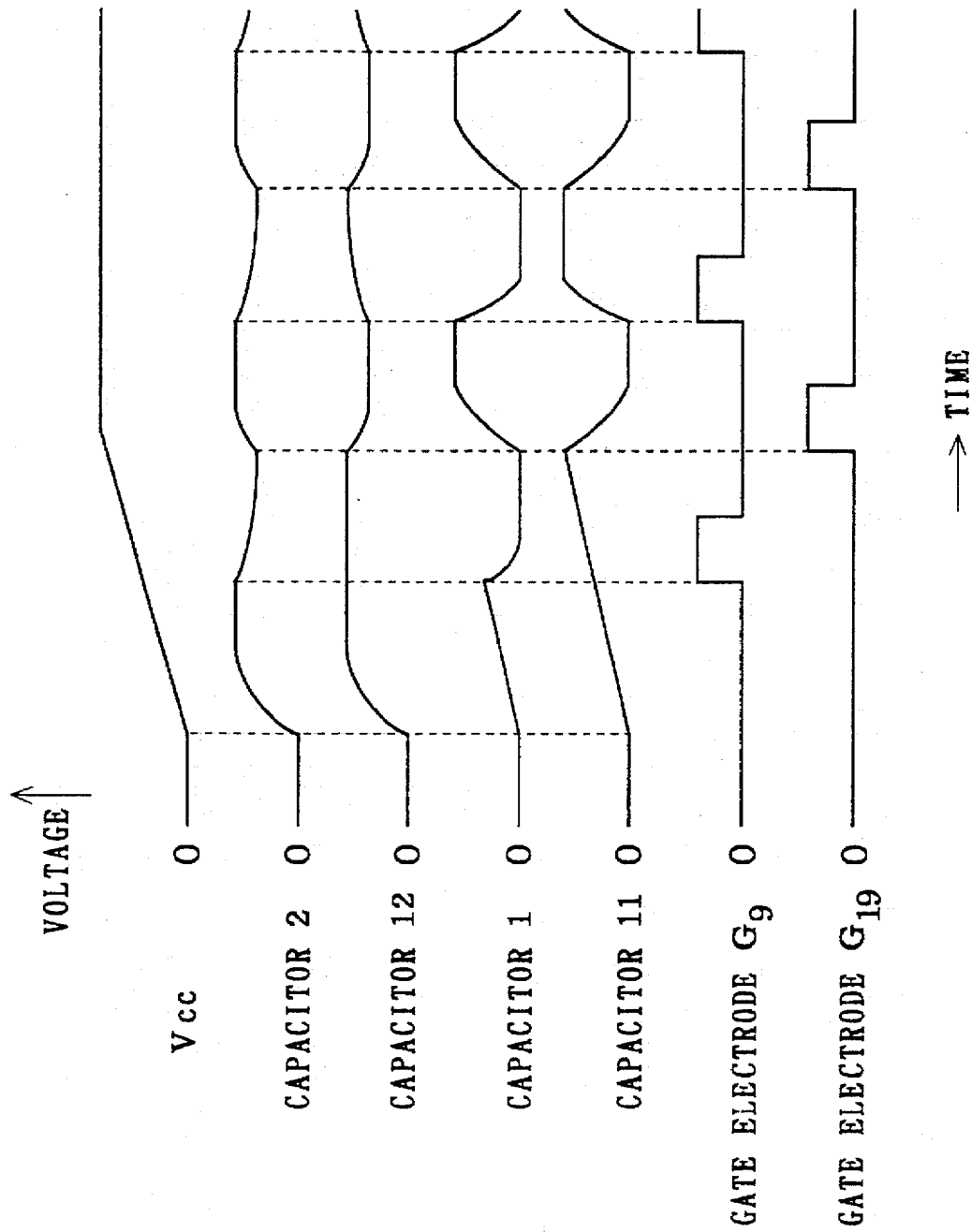
FIG. 2 is a timing chart showing the operation of the device shown in FIG. 1.

FIG. 2 is a timing chart showing voltage waveforms of respective parts following the operation of the bridge device shown in FIG. 1. With reference to FIG. 2, the operation of the bridge device is now described. When an external dc voltage source is connected to the input terminals 20 and 21, the interbus voltage $V_{CC}$ is increased to reach a prescribed stationary voltage after a lapse of a constant time, as shown in FIG. 2. Before the external dc voltage source is connected, i.e., when the operation of the bridge device is stopped, all capacitors 1, 2, 11 and 12 are in discharged states.

Following the increase of the interbus voltage $V_{CC}$, therefore, a current flows from the high-potential dc bus 30 to the low-potential dc bus 31 while successively passing through the capacitor 1, the resistive element 4, the diode 5, the capacitor 2, the intermediate wire 32, the capacitor 11, the resistive element 14, the diode 15 and the capacitor 12. This current is inhibited by the diode 7, to flow neither to the series circuit of the resistive element 6 and the diode 7 nor to the series circuit of the resistive element 16 and the diode 17.

Due to this current, the capacitors 1, 2, 11 and 12 are so charged that storage voltages thereof are increased. Time constants of the increase of these storage voltages are defined by the capacitance values of the capacitors 1, 2, 11 and 12 and the resistance values of the resistive elements 4 and 14. When the storage voltage of the capacitor 2 reaches the Zener voltage (clamp voltage) of the Zener diode 3, this storage voltage is clamped to the Zener voltage by the Zener diode 3. Consequently, the storage voltage of the capacitor 2 is maintained at a constant value also when the current thereafter continuously flows from the high-potential dc bus 30 to the low-potential dc bus 31. Similarly, the storage voltage of the capacitor 12 is clamped to the Zener diode of the Zener diode 13, to be maintained at a constant value.

The Zener voltages of the Zener diodes 3 and 13 are set at values corresponding to source voltages which are sufficient for driving the driving circuits 8 and 18. After the storage voltages of the capacitors 2 and 12 reach the constant values, therefore, the driving circuits 8 and 18 enter operable states. When an input signal (assumed to be at a high level) for turning on the IGBT element 9 is inputted in only one of the input terminals $IN_8$ and $IN_{18}$, such as the input terminal $IN_8$, for example, after the storage voltages of the capacitors 2 and 12 reach the constant values, the driving circuit 8 operates to bring the IGBT element 9 into an ON state. The remaining IGBT element 19 remains in an OFF state.

At this time, a short is caused across the high-potential dc bus 30 and the intermediate wire 32, whereby the current for charging the capacitor 1 is stopped. Since the capacitor 1 has already been charged, the potential of a second electrode of the capacitor 1 is reduced below that of the intermediate wire 32. Consequently, a discharge current for the capacitor 1 flows from the intermediate wire 32 to the high-potential dc bus 30 through the capacitor 1. Thus, the storage voltage of the capacitor 1 is reduced. Its time constant is decided by the capacitance value of the capacitor 1 and the resistance value of the resistive element 6.

This discharge current is inhibited by the diode 5, to flow neither to the capacitor 2 nor to the Zener diode 3. In other words, the capacitor 2 is not discharged by this discharge current. However, the charge current for the capacitor 2 is stopped and hence the storage voltage of the capacitor 2 is gradually reduced following consumption of the charges of the capacitor 2 in the driving circuit 8. The reduction of the storage voltage is rendered smoother as the capacitance value of the capacitor 2 is increased. Therefore, the capacitance value of the capacitor 2 is set at a level capable of guaranteeing the operation of the driving circuit 8 over a necessary period. Since the IGBT element 19 remains in the OFF state, the charge current flowing from the intermediate wire 32 to the low-potential dc bus 31 through the capacitor 11 flows in continuation.

Thereafter a low-level signal is inputted in the input terminal $IN_8$, so that the IGBT element 9 is converted from the ON state to an OFF state. Thereafter a high-level signal is inputted in the input terminal $IN_{18}$, in place of the input terminal $IN_8$. Consequently, the IGBT element 19 is turned on while the IGBT element 9 remains in the OFF state. At this time, a short is caused across the intermediate wire 32 and the low-potential dc bus 31 so that the interbus voltage $V_{CC}$ is applied across the high-potential dc bus 30 and the intermediate wire 32.

Due to the short across the intermediate wire 32 and the low-potential dc bus 31, no current flows for charging the capacitor 11. The potential of the second electrode of the capacitor 1 is reduced below that of the low-potential dc bus 31, since the capacitor 11 has already been charged. Consequently, a discharge current for the capacitor 11 flows from the low-potential dc bus 31 to the intermediate wire 32 through the capacitor 11. The capacitor 11 is discharged by this discharge current. Its time constant is decided by the capacitance value of the capacitor 11 and the resistance value of the resistive element 16.

This discharge current is inhibited by the diode 15, whereby the capacitor 12 is not discharged by this discharge current. However, the charge current for the capacitor 12 is stopped and hence the storage voltage of the capacitor 12 is gradually reduced following current consumption in the driving circuit 18. The capacitance value of the capacitor 12 is set at a level capable of guaranteeing the operation of the driving circuit 18 over a necessary period.

The IGBT element 9 is in the OFF state and the interbus voltage $V_{CC}$ is applied across the high-potential dc bus 30 and the intermediate wire 32, whereby the charge current for charging the capacitors I and 2 again flows from the high-potential dc bus 30 to the intermediate wire 32. Consequently, the storage voltage of the capacitor 2 recovers to the value of the Zener voltage of the Zener diode 3. Further, the storage voltage of the capacitor 11 is again increased.

Thereafter high-level signals are alternately inputted in the input terminals $IN_8$ and $IN_{18}$, whereby the IGBT elements 9 and 19 alternately repeat ON states as the result. Thus, the capacitors 1 and 11 alternately repeat charging and discharging, while the capacitors 2 and 12 also alternatively repeat reduction and recovery of the storage voltages.

The capacitance values of the capacitors 1, 11, 2 and 12 and the resistance values of the resistive elements 4, 6, 14 and 16 are so set that the time constants of charging and discharging of the capacitors 1 and 11 are sufficiently short as compared with the cycle of repetition, the reduction of the storage voltages of the capacitors 2 and 12 is so slow as to sufficiently guarantee the operations of the driving circuits 8 and 18 in the cycle of repetition, and recovery of the storage voltages of the capacitors 2 and 12 by charging is sufficiently quickly completed as compared with the cycle of repetition.

In the IGBT modules and the bridge device according to this embodiment, as hereinabove described, the power circuits for the driving circuits 8 and 18 are formed only by the capacitors, the resistive elements, the Zener diodes and the diodes. Namely, the power circuits for the driving circuits 8 and 18 are formed by only simple passive circuit elements, with no requirement for transformers and active integrated circuit elements which have been required in the conventional device. Thus, the IGBT modules or the bridge circuit can be readily packaged with inclusion of the power circuits for the driving circuits 8 and 18. Consequently, no power supply units for the driving circuits to be connected to the exterior are required, the structure is simplified, the fabrication costs in design and assembling stages are extremely reduced, and a miniature and lightweight device is implemented.

<2. Second Embodiment>

Figure 3:
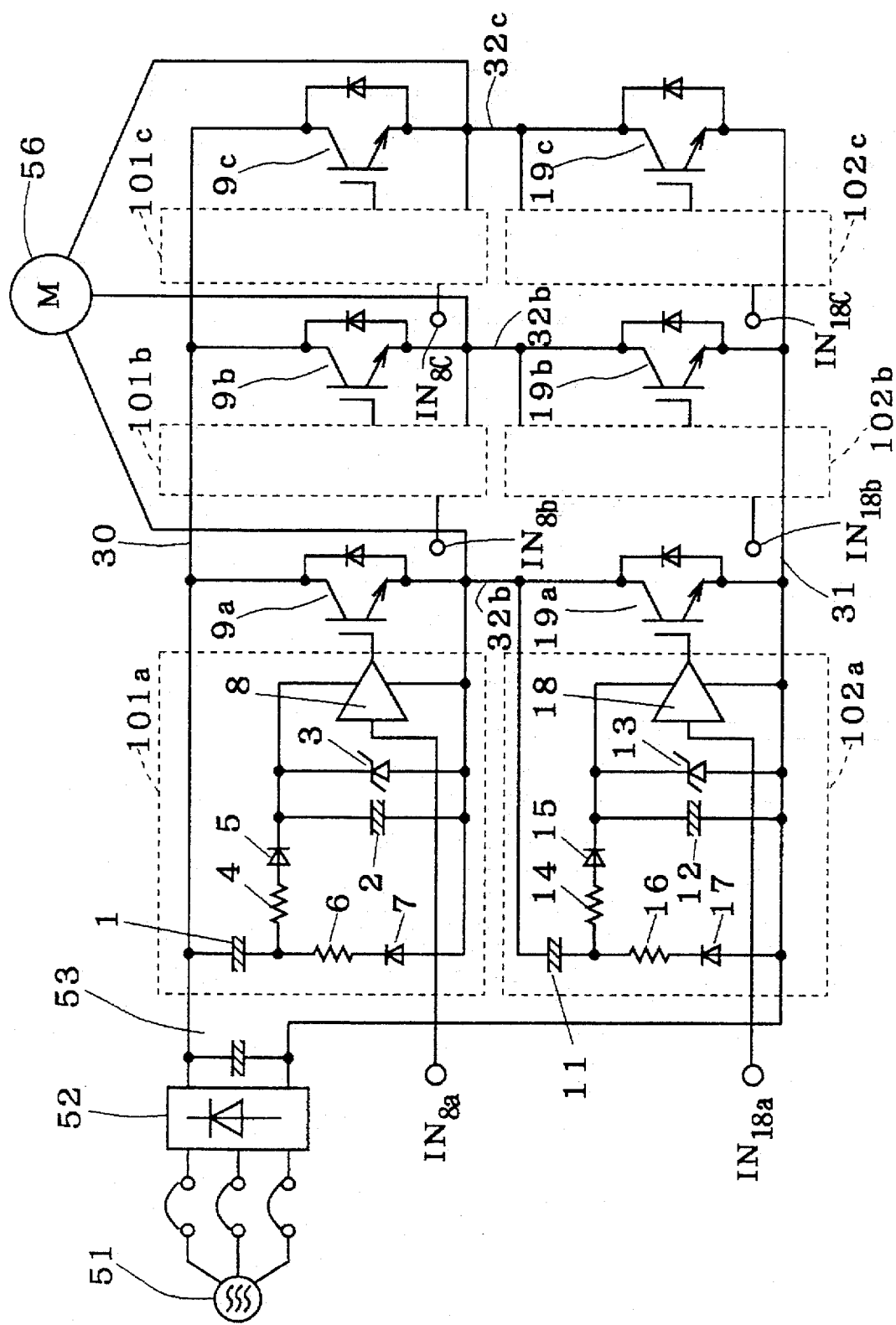
FIG. 3 is a circuit diagram showing the structure of a device according to a second embodiment.

FIG. 3 is a circuit diagram showing the structure of an invertor device according to a second embodiment of the present invention. This device comprises a three-phase bridge device consisting of three bridge devices which are connected in parallel with each other. Namely, bridge devices corresponding to respective ones of three phases are interposed between a common high-potential dc bus 30 and a common low-potential dc bus 31. In each bridge device, two IGBT modules which are identical in structure to those of the first embodiment are interposed between the high-potential dc bus 30 and the low-potential dc bus 31. Namely, all IGBT elements 9a, 9b, 9c, 19a, 19b and 19c are identical to the IGBT elements 9 and 19, while all driving circuit blocks 101a, 101b, 101c, 102a, 102b and 102c are identical in circuit structure to the driving circuit blocks 101 and 102.

Three power supply lines of an external load 56 are connected to intermediate wires 32a, 32b and 32c connecting the pairs of IGBT modules forming the respective bridge devices respectively. Further, a rectifying circuit 52 and a smoothing capacitor 53 are connected to the two dc buses 30 and 31. A three-phase ac voltage which is supplied from the external three-phase ac power source 51 is converted to a dc voltage by the rectifying circuit 52. The dc voltage is smoothed by the smoothing capacitor 53, and supplied to the three-phase bridge device by the dc buses 30 and 31.

The pairs of IGBT modules forming the respective bridge devices carry out operations similar to those of the IGBT modules 40 and 41 of the first embodiment. Namely, high-level signals are alternately inputted in input terminals $IN_{8a}$ and $IN_{18a}$ so that the IGBT elements 9a and 19a alternately repeat ON operations. Similarly, high-level signals are also alternately inputted in remaining input terminals $IN_{8b}$ and $IN_{18b}$ and $IN_{8c}$ and $IN_{18c}$. Further, these input signals are so inputted that the three bridge devices are 120° out of phase from each other. Consequently, a three-phase alternating current is supplied from the three intermediate wires 32a, 32b and 32c to the load 56.

Thus, it is possible to form an invertor device of a simple structure requiring no transformer etc. by connecting the bridge devices according to the first embodiment in parallel with each other.

While three bridge circuits are connected in parallel with each other to form the invertor device outputting a three-phase alternating current in this embodiment, it is also possible to form an invertor device outputting a single-phase alternating current by connecting two bridge circuits in parallel with each other.

<3. Third Embodiment>

Figure 4:
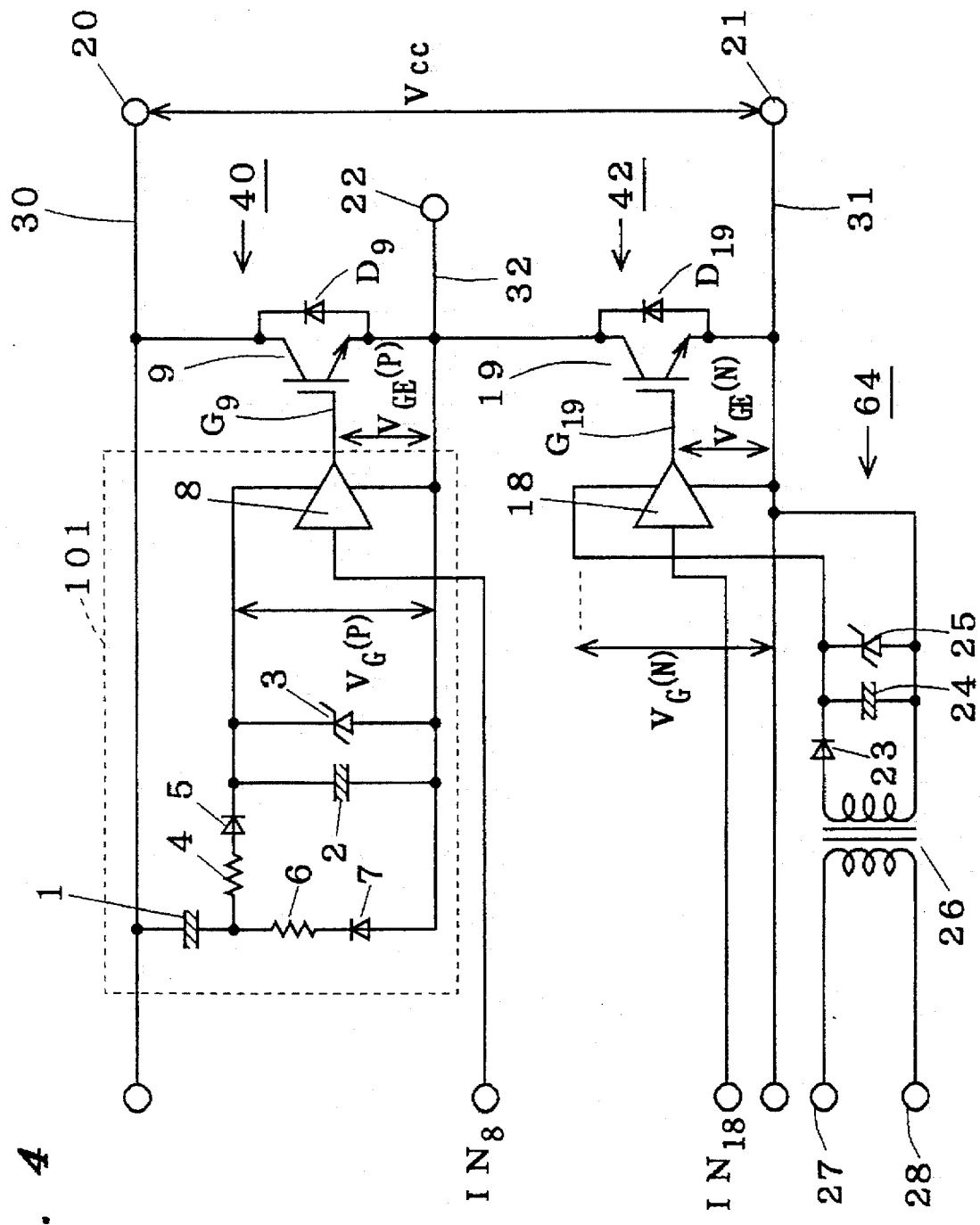
FIG. 4 is a circuit diagram showing the structure of a device according to a third embodiment.

FIG. 4 is a circuit diagram showing a bridge device according to a third embodiment of the present invention. In this bridge device, two IGBT modules 40 and 42 are interposed between a high-potential dc bus 30 and a low-potential dc bus 31. Namely, this bridge device has such a structure that the IGBT module 41 is replaced by the IGBT module 42 in the bridge device according to the first embodiment.

Similarly to the IGBT module 41 according to the first embodiment, the IGBT module 42 comprises an IGBT element 19 as a switching semiconductor element. The IGBT element 19 has a collector electrode which is connected to an intermediate wire 32, and an emitter electrode which is connected to a low-potential dc bus 31. Further, a driving circuit 18 is connected to a gate electrode $G_{19}$ of the IGBT element 19, similarly to the IGBT module 41.

Figure 8:
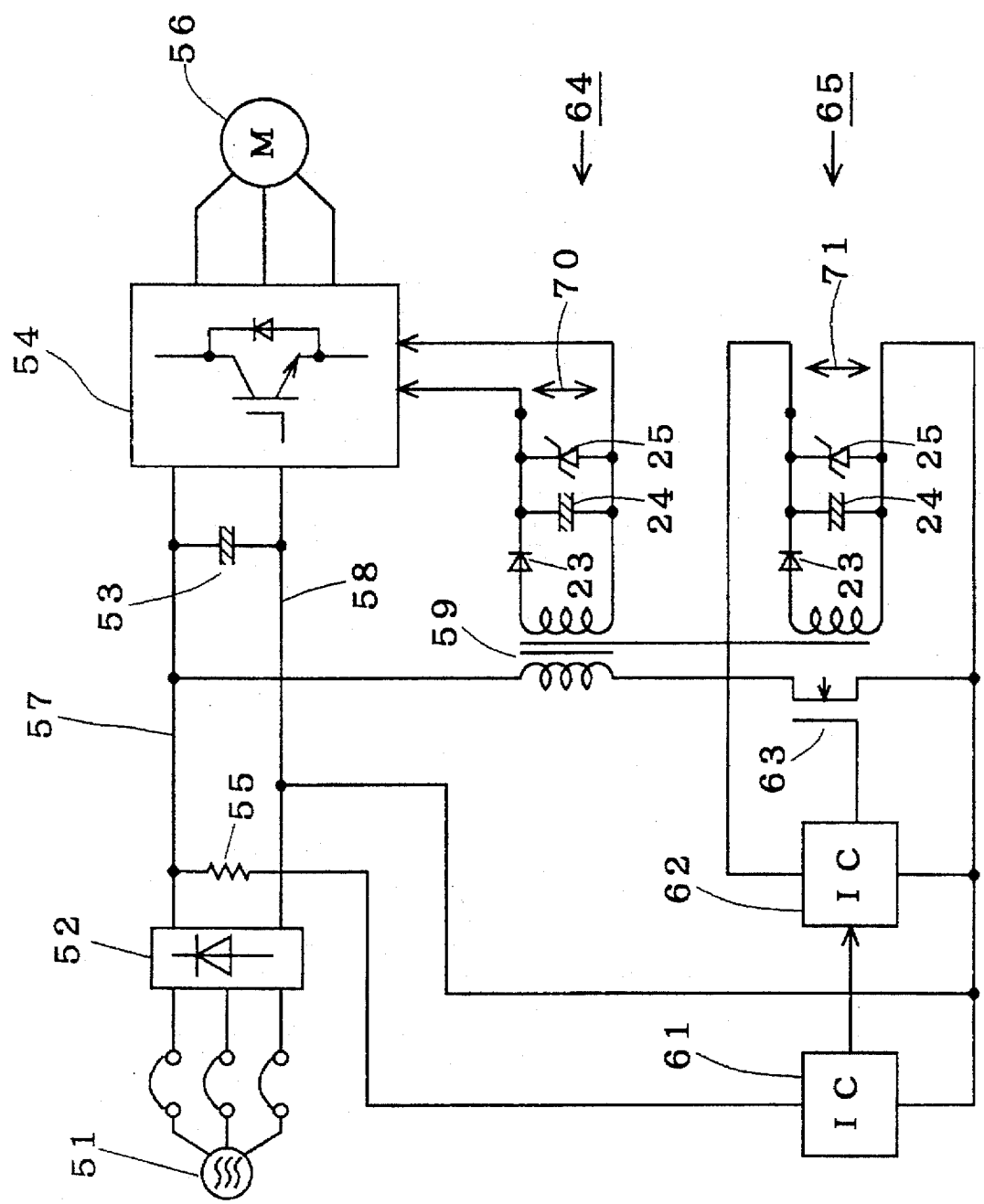
FIG. 8 is a circuit diagram showing the structure of a conventional device.
Figure 9:
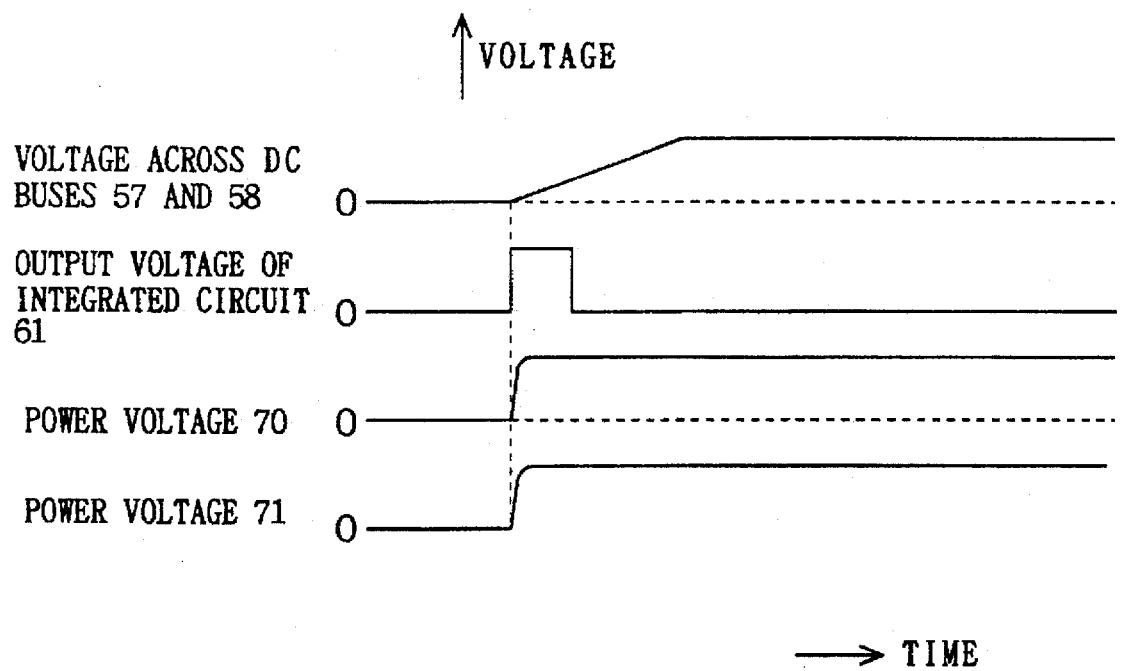
FIG. 9 is a timing chart showing the operation of the device shown in FIG. 8.

In the IGBT module 42, a power circuit 64 for supplying a source voltage to the driving circuit 18 is structured similarly to the power circuit 64 of the conventional device (FIG. 8), dissimilarly to the IGBT module 41. The power circuit 64 is connected to a secondary winding of a transformer 26, so that this power circuit 64 forms a dc source voltage upon application of an ac voltage across primary winding terminals 27 and 28, which are connected to a primary winding, from the exterior.

Figure 5:
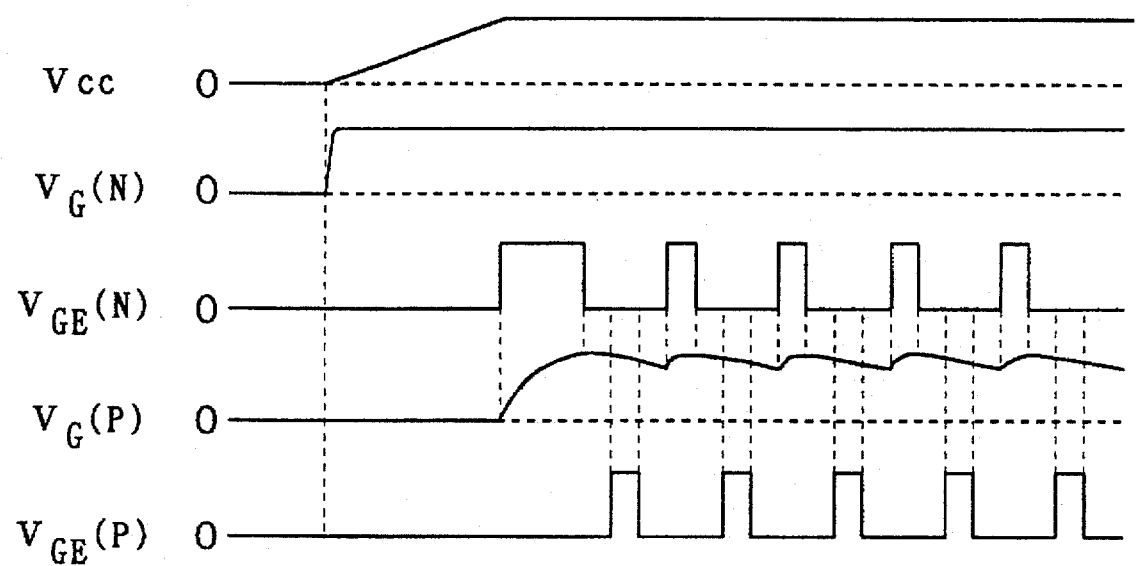
FIG. 5 is a timing chart showing the operation of the device shown in FIG. 4.

FIG. 5 is a timing chart showing voltage waveforms of respective parts following the operation of the bridge device shown in FIG. 4. When an external dc voltage source is connected to input terminals 20 and 21, an interbus voltage $V_{CC}$ is increased to reach a prescribed stationary voltage after a lapse of a constant time, as shown in FIG. 5. Simultaneously with the connection of the external dc voltage source, an ac voltage source is connected to the primary winding terminals 27 and 28 of the transformer 26. Consequently, the power circuit 64 starts its operation, a dc source voltage $V_G(N)$ which is supplied to the driving circuit 18 immediately reaches a stationary value defined by a Zener diode 25, and the driving circuit 18 enters an operable state.

Thereafter a high-level signal is inputted in an input terminal $IN_{18}$, thereby bringing a gate voltage $V_{GE}(N)$ of the IGBT element 19 into a value exceeding a gate threshold voltage and turning on the IGBT element 19. Thus, a short is caused across the intermediate wire 32 and the low-potential dc bus 31, whereby a charge current for charging capacitors 1 and 2 which have been in discharged states before the connection of the external dc voltage source flows from the high-potential dc bus 30 to the low-potential dc bus 31 successively through a capacitor 1, a resistive element 4, a diode 5, a capacitor 2, the intermediate wire 32 and the IGBT element 19. Consequently, a dc source voltage $V_G(P)$ which is supplied to the driving circuit 8 is increased, to finally reach a prescribed stationary value defined by the Zener diode 3.

Thereafter a low-level signal is inputted in the input terminal $IN_{18}$, to turn off the IGBT element 19. Thereafter a high-level signal is inputted in an input terminal $IN_8$ in place of the input terminal $IN_{18}$, to bring a gate voltage $V_{GE}(P)$ of the IGBT element 9 to a value exceeding the gate threshold voltage. Consequently, the IGBT element 9 is turned on while the IGBT element 19 is maintained in an OFF state. At this time, a short is caused across the high-potential dc bus 30 and the intermediate wire 32, whereby a discharge current for discharging the capacitor 1 which has already been charged flows from the intermediate wire 32 to the high-potential dc bus 30 successively through a diode 7, a resistive element 6 and the capacitor 1. Consequently, the capacitor 1 is substantially completely discharged, while the storage voltage of the capacitor 2 is somewhat reduced following current consumption in the driving circuit 8.

Thereafter high-level signals are alternately inputted in the input terminals $IN_8$ and $IN_{18}$, whereby the IGBT elements 9 and 19 alternately repeat ON states. Thus, the capacitor 1 alternately repeats charging and discharging, while the capacitor 2 also alternately repeats reduction and recovery of the storage voltage.

In the bridge device according to this embodiment, as hereinabove described, a sufficiently high source voltage can be supplied to the driving circuit 18 on the leading edge of the interbus voltage $V_{CC}$ regardless of the interbus voltage $V_{CC}$, whereby the driving circuit 18 reliably enters an operable state. The operable driving circuit 18 is so turned on that the interbus voltage $V_{CC}$ is applied to the IGBT module 40 as such (not by half). Consequently, charging of the capacitors 1 and 2 is quickened and the dc source voltage $V_G(P)$ can be made to readily reach a sufficiently high voltage value which is necessary for the operation of the driving circuit 8. Namely, the device can be advantageously readily started also when the interbus voltage $V_{CC}$ is not sufficiently high as compared with the value of the source voltage which is necessary for driving the driving circuit 8.

Further, the power circuit for the driving circuit of one of the two IGBT modules is formed similarly to that of the first embodiment, whereby a device which is simpler, at a lower cost, miniaturized and lightweight as compared with the conventional device is implemented. Also when the transformer 26, the power circuit 64 and the like are not integrated into the bridge device to serve as external units, the external units to be prepared may be those corresponding to a single IGBT module, whereby these units are simple and lightweight as compared with the conventional external units.

<4. Fourth Embodiment>

Figure 6:
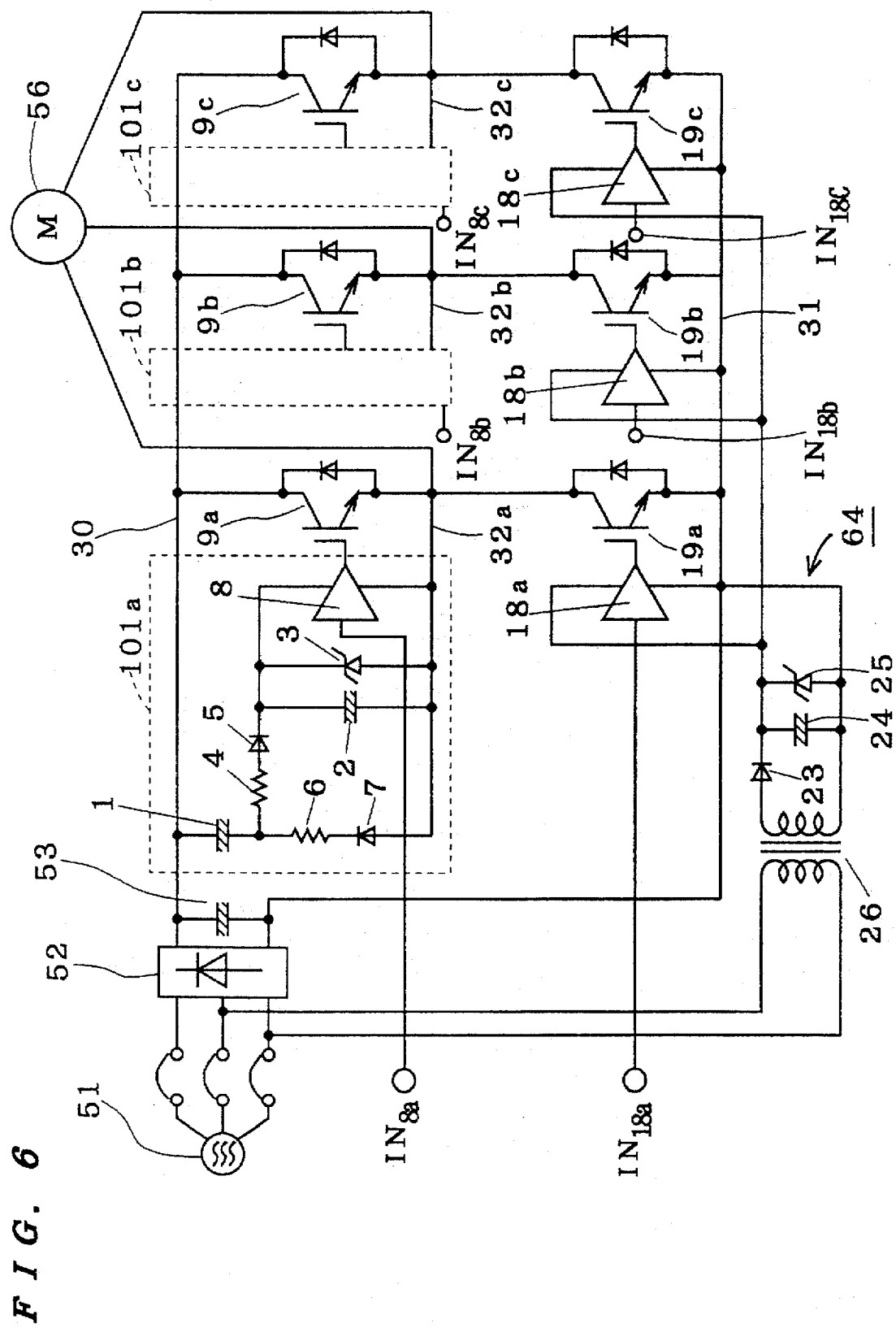
FIG. 6 is a circuit diagram showing the structure of a device according to a fourth embodiment.

FIG. 6 is a circuit diagram showing the structure of an invertor device according to a fourth embodiment of the present invention. This device comprises a three-phase bridge device consisting of three bridge devices which are connected in parallel with each other. Namely, bridge devices corresponding to respective ones of three phases are interposed between a common high-potential dc bus 30 and a common low-potential dc bus 31. The respective bridge devices are identical in structure to those of the third embodiment.

Namely, all driving circuits 18a, 18b and 18c are identical to the driving circuit 18. A dc source voltage for the three driving circuits 18a, 18b and 18c is supplied by a common power circuit 64. A primary winding of a transformer 26 is connected to two power supply wires of an external three-phase ac power source 51.

Pairs of IGBT modules forming the respective bridge devices carry out operations similar to those of the IGBT modules 40 and 42 of the third embodiment. Namely, high-level signals are alternately inputted in input terminals $IN_{8a}$ and $IN_{18a}$ so that IGBT elements 9a and 19a alternately repeat ON operations. Similarly, high-level signals are also alternately inputted in remaining input terminals $IN_{8b}$ and $IN_{18b}$ and $IN_{18c}$ and $IN_{8c}$. Further, these input signals are so inputted that the three bridge devices are 120° out of phase from each other. Consequently, a three-phase alternating current is supplied from three intermediate wires 32a, 32b and 32c to a load 56.

Thus, it is possible to structure an invertor device which is lightweight and miniaturized as compared with the conventional device by connecting the bridge devices according to the third embodiment in parallel with each other.

<5. Fifth Embodiment>

Figure 7:
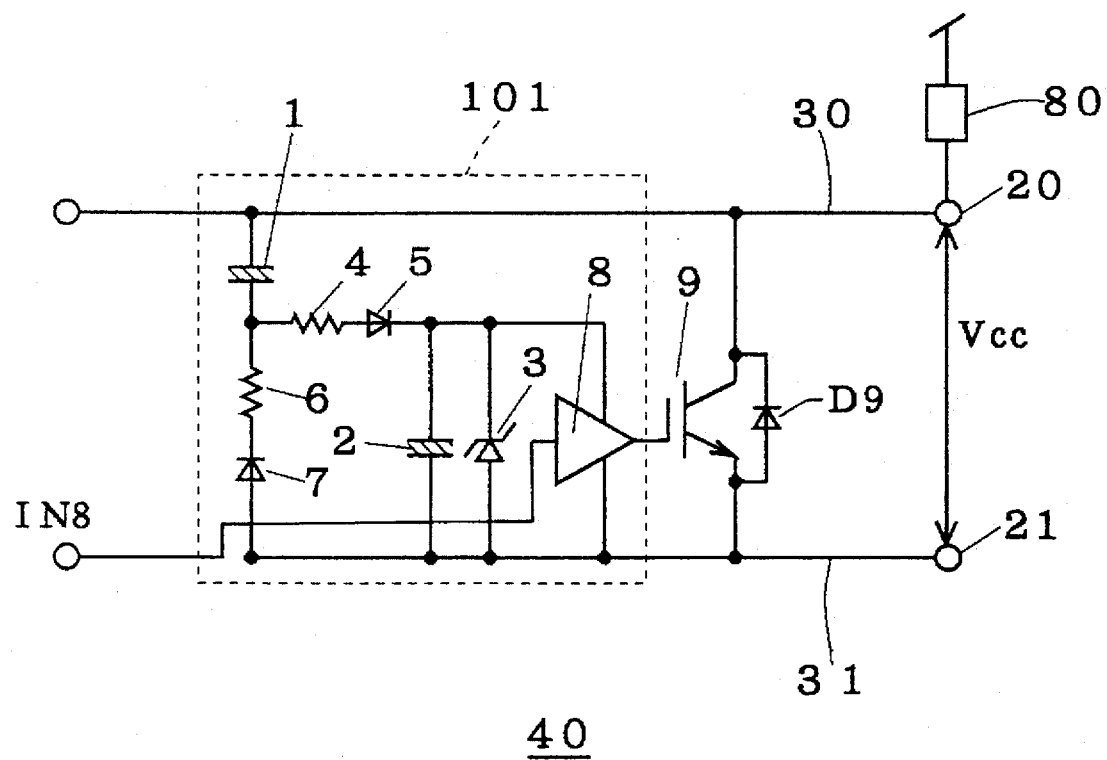
FIG. 7 is a circuit diagram showing the structure of a device according to a fifth embodiment.

FIG. 7 is a circuit diagram showing the structure of an IGBT module 40 according to a fifth embodiment of the present invention. As shown in this embodiment, the IGBT module 40 can be independently employed as a single device. This IGBT module 40 is a device part which is integrated into the bridge device or the invertor device according to any of the first to fourth embodiments, and hence detailed description thereof is omitted.

As shown in FIG. 7, the single IGBT module 40 is connected between a high-potential dc bus 30 and a low-potential dc bus 31. Input terminals 20 and 21 are connected to an external dc voltage source through a load 80.

When the input terminals 20 and 21 are connected to the external dc voltage source through the load 80, an interbus voltage $V_{CC}$ is increased to reach a prescribed stationary voltage after a lapse of a constant time. Before the external dc voltage source is connected, i.e., when the operation of the bridge device is stopped, both capacitors 1 and 2 are in discharged states. Following increase of the interbus voltage $V_{CC}$, therefore, a current flows from the high-potential dc bus 30 to the low-potential dc bus 31 while successively passing through a capacitor 1, a resistive element 4, a diode 5, and a capacitor 2. The capacitors 1 and 2 are charged by this current, so that the storage voltages thereof are increased. Consequently, a dc source voltage which is supplied to a driving circuit 8 is increased to finally reach a prescribed stationary value which is defined by a Zener diode 3, whereby the driving circuit 8 enters an operable state.

Thereafter a high-level signal is inputted in an input terminal $IN_8$, to turn on an IGBT element 9. At this time, a short is caused across the high-potential dc bus 30 and the low-potential dc bus 31, whereby a discharge current for discharging the capacitor 1 which has already been charged flows from the low-potential dc bus 31 to the high-potential dc bus 30 while successively passing through the diode 7, the resistive element 6 and the capacitor 1. Consequently, the capacitor 1 is substantially completely discharged, while the storage voltage of the capacitor 2 is somewhat reduced following current consumption in the driving circuit 8.

Thereafter high-level and low-level signals are alternately inputted in the input terminal $IN_8$. Consequently, the IGBT element 9 alternately repeats ON and OFF states. Thus, the capacitor 1 alternately repeats charging and discharging, while the capacitor 2 also alternately repeats reduction and recovery of the storage voltage. Thus, the driving circuit 8 is regularly set in an operable state, whereby the IGBT module 40 maintains a correct operation.

In the IGBT module of this embodiment, as hereinabove described, the power circuit for the driving circuit 8 is formed only by the capacitor, the resistive element, the Zener diode and the diode. Namely, the power circuit for the driving circuit 8 is formed only by simple passive circuit elements, with no requirement for a transformer and an active integrated circuit element which have been required in the conventional device. Therefore, the IGBT module including the power circuit for the driving circuit 8 can be readily packaged. Consequently, no power supply unit for the driving circuit to be connected to the exterior is required, the structure is simplified, the fabrication costs in design and assembling stages are extremely reduced, and a miniature and lightweight device is implemented.

<6. Sixth Embodiment>

While N-channel IGBT elements are employed as the switching semiconductor elements in the first to fifth embodiments, the N-channel IGBTs may be replaced by P-channel IGBTs, N-channel MOSFETs, P-channel MOSFETs or bipolar transistors. When the IGBT elements 9 and 19 are replaced by P-channel MOSFETs in the IGBT modules shown in FIG. 1, for example, directions of all diodes (including the Zener diodes) 3, 5, 7, $D_9$, 13, 15, 17 and $D_{19}$ may be reversed. A device which is structured in such a manner is employed by applying low and high potential dc source voltages to the dc buses 30 and 31 respectively, contrarily to the device shown in FIG. 1.

In order to reduce current consumption in the driving circuits 8 and 18 and reducing the capacitances of the capacitors 1, 2, 11 and 12 etc. thereby miniaturizing the device, insulated gate switching semiconductor elements such as IGBTs or MOSFETs are preferably employed as the switching semiconductor elements.

While the invention has been shown and described in detail, the foregoing description is in all aspects illustrative and not restrictive. It is therefore understood that numerous modifications and variations can be devised without departing from the scope of the invention.

What is claimed is:

1. A switching semiconductor device comprising:
   a switching semiconductor element allowing conduction between first and second main electrodes and cutting off the same;

a driving circuit entering an operable state due to supply of a dc source voltage across a first source electrode and a second source electrode being connected to said second main electrode and driving said switching semiconductor element in response to an external input signal;

a first capacitor having a first end being connected to said first main electrode of said switching semiconductor element;

a first circuit being interposed between a second end of said first capacitor and said first source electrode of said driving circuit;

a second circuit being interposed between said second end of said first capacitor and said second main electrode of said switching semiconductor element;

a second capacitor being connected between said first and second source electrodes; and a clamp element being connected between said first and second source electrodes for clamping a voltage across said first and second source electrodes at a constant value in an operable range of said driving circuit, said first circuit comprising a first diode being so inserted as to feed a current only in a direction for supplying said dc source voltage across said first and second source electrodes by charging said second capacitor, said second circuit comprising a second diode being so inserted as to feed a current only in a direction being opposite to that of said current flowing in said first circuit with respect to said first capacitor.

2. The switching semiconductor device in accordance with claim 1, wherein said first circuit further comprises a first resistive element connected in series with said first diode, and said second circuit further comprises a second resistive element connected in series with said second diode.

3. The switching semiconductor device in accordance with claim 1, wherein said clamp element comprises a Zener diode clamping said voltage across said first and second source electrodes at said constant value by a Zener voltage.

4. The switching semiconductor device in accordance with claim 1, wherein said switching semiconductor element comprises an insulated gate switching semiconductor element.

5. A switching semiconductor device comprising first and second unit semiconductor devices being connected in series with each other, each of said first and second unit semiconductor devices comprising:

a switching semiconductor element allowing conduction between first and second main electrodes and cutting off the same, and a driving circuit entering an operable state due to supply of a dc source voltage across a first source electrode and a second source electrode being connected to said second main electrode and driving said switching semiconductor element in response to an external input signal, at least one of said first and second unit semiconductor devices comprising:

a first capacitor having a first end being connected to said first main electrode of said switching semiconductor element, a first circuit being interposed between a second end of said first capacitor and said first source electrode of said driving circuit, a second circuit being interposed between said second end of said first capacitor and said second main electrode of said switching semiconductor element, a second capacitor being connected between said first and second source electrodes, and a clamp element being connected between said first and second source electrodes for clamping a voltage across said first and second source electrodes at a constant value in an operable range of said driving circuit, said first circuit comprising a first diode being so inserted as to feed a current only in a direction for supplying said dc source voltage across said first and second source electrodes by charging said second capacitor, said second circuit comprising a second diode being so inserted as to feed a current only in a direction being opposite to that of said current flowing in said first circuit with respect to said first capacitor, said first and second unit semiconductor devices being connected in series with each other through connection between said second main electrode of said first unit semiconductor device and said first main electrode of said second unit semiconductor device.

6. The switching semiconductor device in accordance with claim 5, wherein each of said first and second unit semiconductor devices comprises:

said first capacitor, said first circuit, said second circuit, said second capacitor, and said clamp element.

7. The switching semiconductor device in accordance with claim 5, wherein only one of said first and second semiconductor devices comprises:

said first capacitor, said first circuit, said second circuit, said second capacitor, and said clamp element, the other one of said first and second unit semiconductor devices further comprising:

a transformer having a first winding being connected to said first and second source electrodes of said driving circuit being provided on said other one, a third diode being interposed between said first winding and said first or second source electrode of said other one, a third capacitor being connected between said first and second source electrodes of said other one, and another clamp element being connected between said first and second source electrodes of said other one for clamping said voltage across said first and second source electrodes at a constant value in an operable range of said driving circuit of said other one, said third diode being so interposed as to feed a forward current in a direction for supplying a dc source voltage capable of driving said driving circuit of said other one across said first and second source electrodes of said other one by charging said third capacitor.

8. The switching semiconductor device in accordance with claim 5, further comprising:

a plurality of bridge circuits being connected in series with each other, each of said plurality of bridge circuits comprising:

said first and second unit semiconductor devices being connected in series with each other, said first and second unit semiconductor devices being connected in series with each other through connection between said second main electrode of said first unit semiconductor device and said first main electrode of said second unit semiconductor device, said first main electrodes of said first unit semiconductor devices belonging to respective ones of said plurality of bridge circuits being connected with each other, said second main electrodes of said second unit semiconductor devices belonging to respective ones of said plurality of bridge circuits being connected with each other, thereby connecting said plurality of bridge circuits in parallel with each other.

9. The switching semiconductor device in accordance with claim 5, wherein said first circuit further comprises a first resistive element connected in series with said first diode, and said second circuit further comprises a second resistive element connected in series with said second diode.

10. The switching semiconductor device in accordance with claim 5, wherein said clamp element comprises a Zener diode clamping said voltage across said first and second source electrodes at said constant value by a Zener voltage.

11. The switching semiconductor device in accordance with claim 5, wherein said switching semiconductor element comprises an insulated gate switching semiconductor element.

* * * * *